United States Patent
Karlicek, Jr.

(10) Patent No.: US 10,410,958 B2
(45) Date of Patent: Sep. 10, 2019

(54) STRAIN-TOLERANT DIE ATTACH WITH IMPROVED THERMAL CONDUCTIVITY, AND METHOD OF FABRICATION

(71) Applicant: SolidUV, Inc., Clifton Park, NY (US)

(72) Inventor: Robert F. Karlicek, Jr., Mechanicville, NY (US)

(73) Assignee: SolidUV, Inc., Clifton Park, NY (US)

(*) Notice: Subject to any disclaimer, the term of this patent is extended or adjusted under 35 U.S.C. 154(b) by 0 days.

(21) Appl. No.: 15/659,889

(22) Filed: Jul. 26, 2017

(65) Prior Publication Data
US 2017/0323844 A1 Nov. 9, 2017

Related U.S. Application Data

(60) Provisional application No. 62/370,638, filed on Aug. 3, 2016.

(51) Int. Cl.
*H01L 23/48* (2006.01)
*H01L 21/00* (2006.01)
(Continued)

(52) U.S. Cl.
CPC ...... *H01L 23/49513* (2013.01); *H01L 23/345* (2013.01); *H01L 23/36* (2013.01);
(Continued)

(58) Field of Classification Search
CPC .......... H01L 23/49513; H01L 23/345; H01L 23/367; H01L 23/3736; H01L 23/42; H01L 23/4334; H01L 23/4951; H01L 24/04
See application file for complete search history.

(56) References Cited

U.S. PATENT DOCUMENTS 5,687,062 A * 11/1997 Larson .................. H01L 23/142
174/252
5,825,087 A * 10/1998 Iruvanti .............. H01L 21/4878
257/707
(Continued)

FOREIGN PATENT DOCUMENTS

JP 04312933 A * 11/1992 ............. H01L 24/32
JP 2012119485 A 6/2012

OTHER PUBLICATIONS

International Search Report dated Nov. 9, 2017, for counterpart application PCT/US2017/043893.
(Continued)

*Primary Examiner* — Alonzo Chambliss
(74) *Attorney, Agent, or Firm* — Jay R. Yablon (57) ABSTRACT

A mechanically-stable and thermally-conductive interface device between a semiconductor die and a package for the die, and related method of fabrication, comprising: a semiconductor die; a package for the die; a surface area-enhancing pattern on the package and/or the die; and die attach materials between the die and the package, the die attach materials attaching the die to the package through an interface provided by the die attach materials; wherein: an effective bonding area between the die attach materials and the package and/or the die is greater with the pattern than without the pattern; and the increase of the effective bonding area simultaneously increases the surface area for thermal transport between the package and/or the die, and the die attach materials; and increases the surface area for stably attaching the at least one of the package and the die to the die attach materials.

35 Claims, 8 Drawing Sheets

(51) Int. Cl.
*H01L 23/495* (2006.01)
*H01L 23/34* (2006.01)
*H01L 23/36* (2006.01)
*H01L 23/00* (2006.01)
*H01L 23/367* (2006.01)
*H01L 23/373* (2006.01)
*H01L 23/42* (2006.01)
*H01L 23/433* (2006.01)

(52) U.S. Cl.
CPC ........ *H01L 23/367* (2013.01); *H01L 23/3736* (2013.01); *H01L 23/42* (2013.01); *H01L 23/4334* (2013.01); *H01L 23/4951* (2013.01); *H01L 24/04* (2013.01); *H01L 2224/83385* (2013.01)

(56) References Cited

U.S. PATENT DOCUMENTS

| | | | |
|---|---|---|---|
| 6,115,255 A * | 9/2000 | Iovdalsky | H01L 23/3677 |
| | | | 257/796 |
| 6,893,952 B2 * | 5/2005 | Jiang | H01L 24/16 |
| | | | 257/E21.511 |
| 7,589,403 B2 * | 9/2009 | Bauer | H01L 23/3107 |
| | | | 257/676 |
| 8,410,371 B2 | 4/2013 | Andrews et al. | |
| 8,753,924 B2 * | 6/2014 | Wainerdi | H01L 24/29 |
| | | | 257/675 |
| 9,418,909 B1 * | 8/2016 | Chaware | H01L 24/32 |
| 9,613,888 B2 * | 4/2017 | Yoneyama | H01L 23/4952 |
| 10,163,754 B2 * | 12/2018 | Ho | H01L 21/4803 |
| 2002/0106833 A1 * | 8/2002 | Kobayashi | H01L 21/563 |
| | | | 438/108 |
| 2004/0251537 A1 | 12/2004 | Choi | |
| 2005/0067676 A1 | 3/2005 | Mahadevan et al. | |
| 2007/0273017 A1 * | 11/2007 | Maloney | H01L 23/3107 |
| | | | 257/690 |
| 2009/0039486 A1 * | 2/2009 | Shimazaki | H01L 21/561 |
| | | | 257/676 |

OTHER PUBLICATIONS

Written Opinion dated Nov. 9, 2017, for counterpart application PCT/US2017/043893.

H. R. Fard, R. Karlicek, J. Plawsky, T. Borca-Tasciuc, "Reducing thermal interface impedance using surface engineering," Thermal and Thermomechanical Phenomena in Electronic Systems (ITherm) (Sep. 8, 2014) DOI: 10.1109/ITHERM.2014.6892285.

R. J. Linderman, T. Brunschwiler, U. Kloter, H. Toy, B. Michel, "Hierarchical nested surface channels for reduced particle stacking and low resistance thermal interfaces," Semiconductor Thermal Measurement and Management Symposium (Apr. 23, 2007) DOI: 10.1109/STHERM.2007.352392.

W. Park, A. Sood, J. Park, M. Asheghi, R. Sinclair, K. E. Goodson, "Enhanced Thermal Conduction Through Nanostructured Interfaces," Nanoscale and Microscale Thermophysical Engineering (Feb. 17, 2017) DOI: 10.1080/15567265.2017.1296910.

T. Jiang, E. Lee, M.I Young, T. Luo, "Nanostructure-Enabled Significant Thermal Transport Enhancement across Solid Interfaces," Thermal and Thermomechanical Phenomena in Electronic Systems (ITherm) (Jul. 21, 2016) DOI: 10.1109/ITHERM.2016.7517610.

P. M. Norris and P. E. Hopkins, "Examining Interfacial Diffuse Phonon Scattering Through Transient Thermoreflectance Measurements of Thermal Boundary Conductance," J. Heat Transfer 131(4), 043207 (Feb. 20, 2009) doi:10.1115/1.3072928).

D. S. Kim, B. Han, A. Bar-Cohen, "Characterization of Die Attach Thermal Interface of High Power Light Emitting Diodes: An Inverse Approach," IEEE Transactions on Components, Packaging and Manufacturing Technology, 5 (11), 2015, p. 1635, doi: 10.1109/TCPMT.2015.2472400.

* cited by examiner

STRAIN-TOLERANT DIE ATTACH WITH IMPROVED THERMAL CONDUCTIVITY, AND METHOD OF FABRICATION

CROSS-REFERENCE TO RELATED APPLICATIONS

This application claims priority benefit of provisional application U.S. 62/370,638 filed Aug. 3, 2016.

BACKGROUND OF THE INVENTION

Semiconductor die (e.g. light emitting diodes (LEDs) and high power transistors) have flat mounting surfaces and are attached to flat package surfaces using various organic (epoxy-like) or inorganic (solder) attachment methods for packaging the bare semiconductor element (die). This process is known generically as a die attach (D/A) process and the adhesives or solders are known as D/A materials. In addition to holding the die inside the package for subsequent assembly operations like wirebonding and overmolding, this combination of die and package surfaces and D/A materials need to meet several other requirements:
  Accommodate any expansion/contraction of the chip, the package and the die attach material occurring during thermal cycling, which is due to coefficient of thermal expansion (CTE) mismatches between the semiconductor die and the packaging materials.
  Provide high thermal conductivity for conducting heat from the semiconductor die through the package and to the package external surfaces efficiently.
  Be nominally free of voids between the semiconductor die and the mating package surface, for both improved strength and better thermal management.
  Be amenable to high speed assembly processes to ensure low cost of manufacturing.

Ordinarily, the package and die surfaces are clean and flat. But both CTE management and voiding becomes problematic for larger die, and failure can become more of a problem. Voiding can be managed by performing curing or soldering operations in a vacuum environment, but this can be slow and adds expense to the packaging operation.

Figure 1:
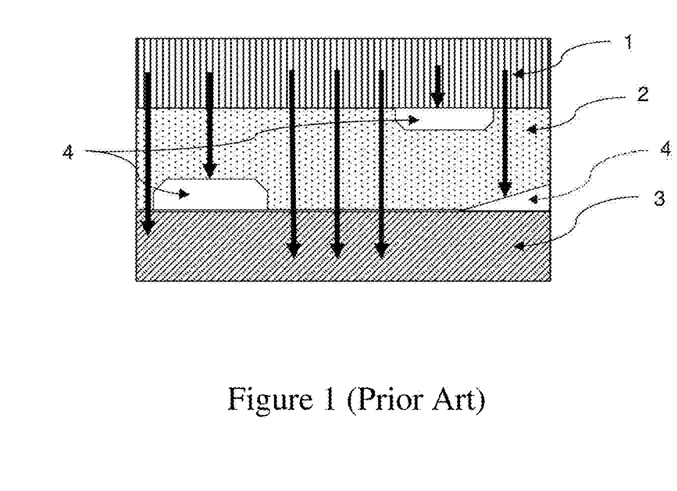
FIG. 1 is a schematic plan view of a typical prior art semiconductor packaging structure showing the semiconductor die, the D/A material, and a portion of the package. The direction of heat flow is shown by the arrows. Voiding is shown as gaps in the D/A material.

Consequently, a fundamental challenge for high power semiconductor device manufacturing and reliable operation involves the creation of a mechanically-stable and thermally-conductive interface between the semiconductor die (where heat is generated) and the package that houses the die and is typically attached to circuit boards to create modern electronic and electro-optical systems. A generic structure that illustrates the challenges encountered in the prior art is shown in FIG. 1, where the D/A material is shown with voids (air gaps) 4 that typically occur during high volume manufacturing operations. Specifically, FIG. 1 illustrates the semiconductor die 1, the D/A material 2, and the package 3 (typically attached at a metal part thereof to the D/A material 2). The direction of heat flow is shown by the downward-pointing arrows. Voiding is shown as gaps 4 in the D/A material 2. These voids 4 can impact both the mechanical stability and thermal performance of the finished device, compromising reliability in operation. There are two related problems that need to be addressed to improve the overall performance of the assembly shown in FIG. 1. The first is to improve the thermal performance. The second is to improve the mechanical performance.

As to thermal performance, semiconductor devices degrade more rapidly at high temperatures than at lower temperatures. The heat generated in the semiconductor die 1 during operation typically needs to be conducted to the environment through the package 3. The efficiency of the cooling process depends on the thermal conductivity of all the materials shown in FIG. 1, as well as the number of interfaces through which thermal energy needs to be transported. The types of interfaces shown in FIG. 1 include:
  Die 1 to air interface (voids 4)
  Air to package 3 interface (voids 4)
  Air to D/A material 2 interface (voids 4)
  Die 1 to D/A material 2 interface
  D/A material 2 interface to package 3

Figure 2:
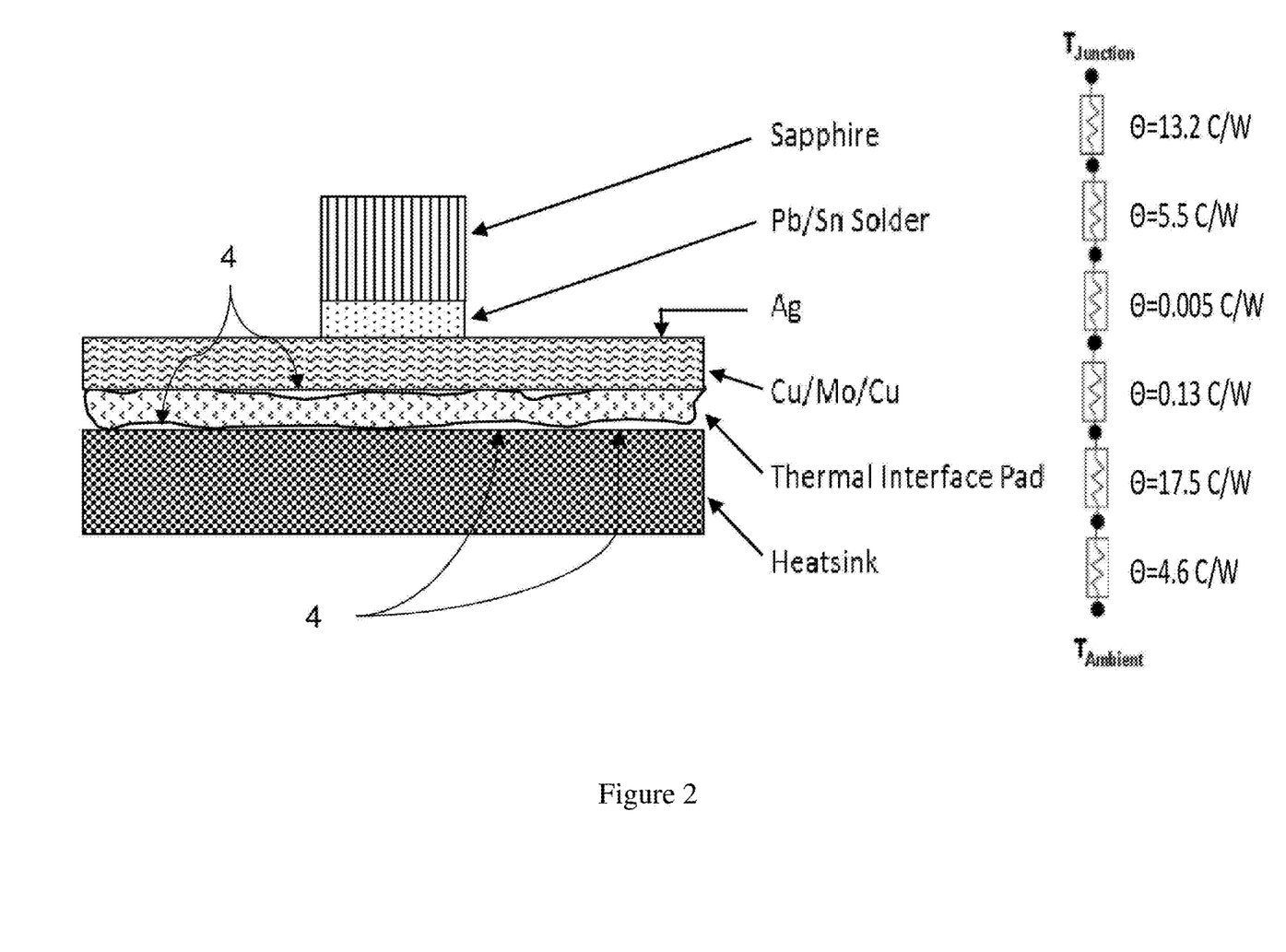
FIG. 2 is a schematic representation of the thermal impedance stack-up of a typical semiconductor die, thermal adhesive interface, package, and external heat sink thermal dissipation system, modelled by a series of variable thermal impedances.

Studies have shown that even when high thermal conductivity materials (die 1, D/A material 2, package 3 materials) are used, transporting thermal energy from one type of material to another, or through air pockets, is a major problem. Generally speaking, this thermal interface resistance is a fundamental property that depends on the materials involved and how heat is transferred at the atomic or molecular level between different types of materials, characterized, for example, by different types of atomic and molecular bonds. Typically, the thermal transport can be characterized in a simplified impedance diagram such as is shown in FIG. 2, which shows a representative, non-limiting example for a complex assembly of die, D/A material, and package. The chip shown here is thermally representative of a typical blue LED where the junction of the LED is in a very thin semiconductor layer on top of the sapphire substrate shown. Of particular interest here is the fact that the thermal path can be described and modelled as a series of thermal "resistors" that impede the transport of heat. FIG. 2 is representative of several of the interfaces in the structure, and the presence of voids 4 can be seen. Note that the specific thermal impedances depend on the specific thicknesses of the layers, which are not shown to scale.

The state of the art involves minimizing the number of interfaces, maximizing the bulk thermal conductivity of all of the materials involved and minimizing the occurrence of voiding. Reducing the thermal interface impedance has only been approached in state-of-the-art packaging to date, by reducing the overall number of interfaces. There appears to have been little if any attention given to changing the fundamental structure of the interfaces involved.

Figure 3:
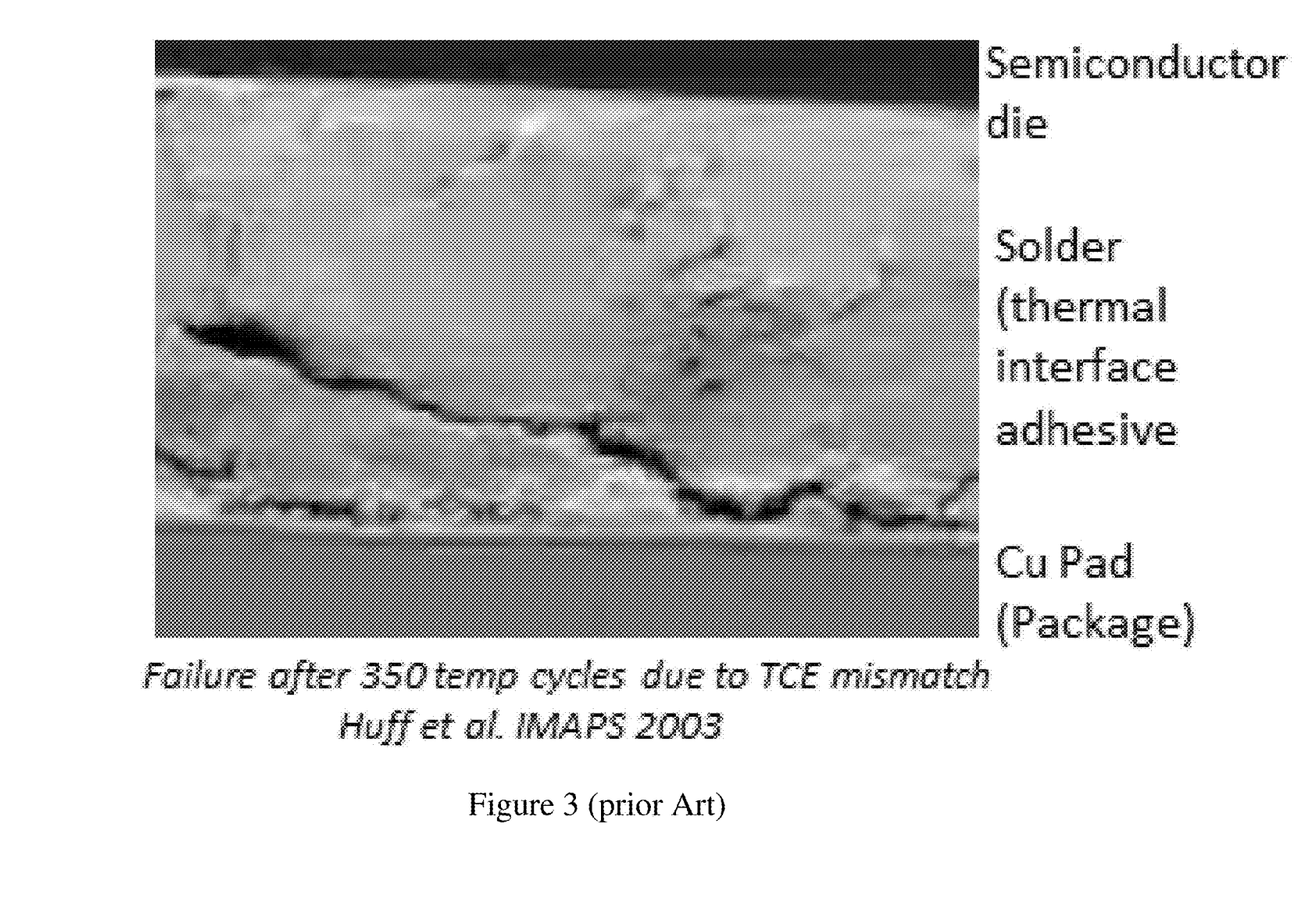
FIG. 3 is an image showing a failed prior art thermal interface having cracks formed during thermal cycling. Here, the D/A material is a solder, shown as a thermal interface adhesive.

As to mechanical performance, modern electronic devices need to operate over a wide range of temperatures. Because most materials used in semiconductor packaging expand different amounts with increasing temperature, mechanical strain can be introduced during thermal cycling of a typical semiconductor part. Shown in FIG. 3 is an image of a failed prior art solder joint in a semiconductor package following thermal cycling reliability testing. The mechanical stability of this part of the package depends on the thermal expansion coefficients of all the materials involved, their elasticity (ability to stretch under strain), the physical dimensions of the interface and the degree of adhesion between the thermal D/A material 2 used and the package 3 and semiconductor die 1 surfaces. Ordinarily, this is managed through a careful cleaning and polishing of interfaces to prevent voiding 4, and through controlling the thickness (usually referred to as a bond line thickness, or BLT) of the D/A material 2 to help distribute strain over a larger distance. Of course, thicker die attach adhesive thicknesses (greater BLT) are better for mechanical reliability, but greater thicknesses also increase thermal resistance. Ideally, one would want to keep the thickness of the thermal interface adhesive material as thin as possible for better thermal performance while also providing high mechanical strength and reliability.

Figure 4:
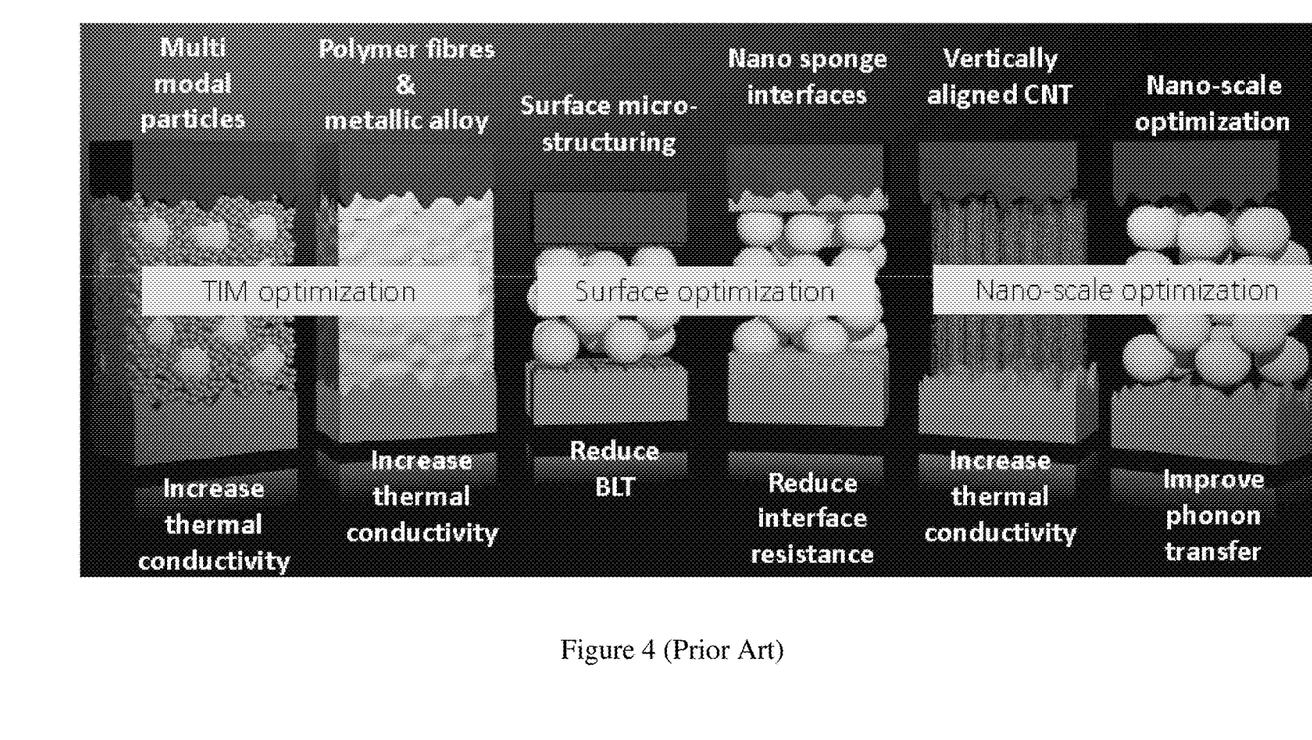
FIG. 4 is a visual overview of the range of technologies being used in the prior art to address thermal and mechanical performance issues in modern semiconductor device packaging. Note that the only interface management method involves nanoparticle void filling materials to compensate for microscopic roughness of the surfaces involved.

A summary of many of the areas being pursued in the prior art to improve the thermal performance and mechanical stability of modern semiconductor packages is shown in FIG. 4. A wide variety of sophisticated technologies are being employed, but the key interface technologies involve filling in the roughness at the die 1 and package 3 interfaces with the thermal interface adhesive to manage micro-voiding (the nano-sponge materials are shown as roughness fillers). Again, little if any attention has been given to changing the fundamental structure of the interfaces involved.

SUMMARY OF THE INVENTION

Disclosed herein is the use of a patterned surface (on either the die, the package mounting surface, or both) to reduce voiding, help manage CTE related reliability failures for large die, and improve thermal conductivity of the chip/package interface to ensure better cooling of the semiconductor die inside the package during operation, all while improving mechanical strength and reliability.

Specifically, what is disclosed is a mechanically-stable and thermally-conductive interface device between a semiconductor die and a package for the die, and related method of fabrication, comprising: a semiconductor die; a package for the die; a surface area-enhancing pattern on the package and/or the die; and die attach materials between the die and the package, the die attach materials attaching the die to the package through an interface provided by the die attach materials; wherein: an effective bonding area between the die attach materials and the package and/or the die is greater with the pattern than without the pattern; and the increase of the effective bonding area simultaneously increases the surface area for thermal transport between the package and/or the die, and the die attach materials; and increases the surface area for stably attaching the at least one of the package and the die to the die attach materials.

BRIEF DESCRIPTION OF THE DRAWINGS

The features of the invention believed to be novel are set forth in the appended claims. The invention, however, together with further objects and advantages thereof, may best be understood by reference to the following description taken in conjunction with the accompanying drawing(s) summarized below.

DETAILED DESCRIPTION

Figure 5:
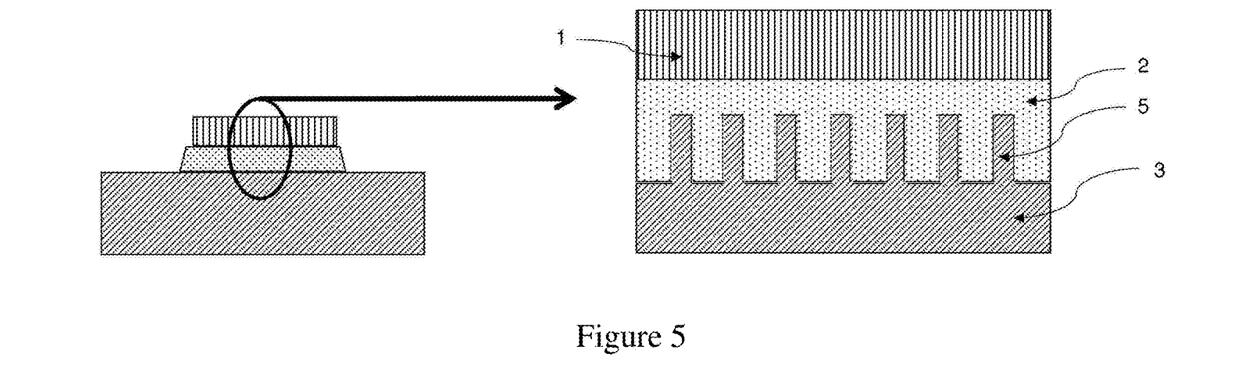
FIG. 5 is a schematic side cross-sectional view illustrating a specialized structure in accordance with the invention, wherein microscopic pillar structures are formed at the interface between the die and the package surface to increase the bonding surface area between the D/A material and the package bonding surface. The right-hand side of FIG. 5 magnifies a small portion of the interface shown on the left.
Figure 6A:
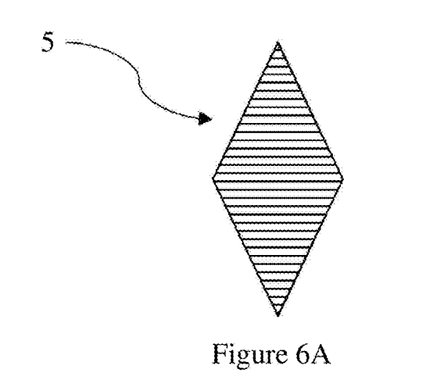
FIGS. 6A, 6B, 6C and 6D are top-down schematic views of various cross-sectional shapes, without limitation, which are possible for the microscopic pillar structures of FIG. 5 used for increasing the effective bonding area (EBA). The shape(s) selected in any given situation depend on various cost, mechanical and thermal requirements for the die attach requirements at hand.
Figure 6B:
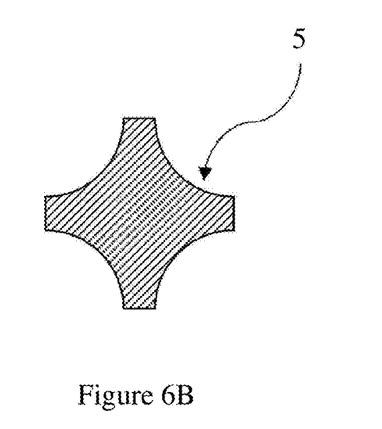
Figure 6C:
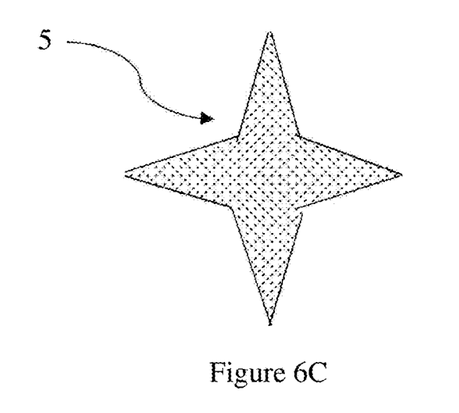
Figure 6D:
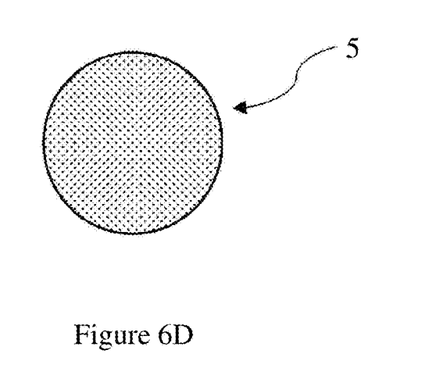

To improve both mechanical stability and thermal performance, this invention employs a specialized structuring of the package 3 and/or die 1 surfaces specifically to increase the contact surface area to the D/A material 2. A side cross-sectional view of an exemplary preferred embodiment of this invention is shown in FIG. 5. The basic concept is to simultaneously increase the available interfacial surface area and create a bond-strengthening structure to simultaneously improve both the mechanical reliability and the thermal performance of the overall structure. Die types envisioned in connection with this invention include but are not limited to: LEDs, Laser diodes, microprocessors, power transistors, and power application specific integrated circuits (ASICs).

The structure shown in FIG. 5 is comprises a patterned package 3 surface or submount comprising a surface area-enhancing pattern 5 (for example, not limitation, a large plurality of microscopic copper pillars) that extends through part of the distance (generally, at least 40%) between the submount package 3 and the die 1. The structure shown envisions that there are no voids 4 (though that is not a requirement of the invention). A preferred embodiment of the invention involves the use of a D/A material 2 comprising a strong, high-conductivity sintered nano-silver, selected so that complete filling between the pattern 5 pillars is possible. In addition to nano-silver, solders would be a suitable D/A material 2 for this invention. It is noted here that in many D/A materials, an adhesive-like epoxy or silicon is loaded with high-conductivity particles (Silver (Ag) or Boron Nitride (BN)) that can sometimes be larger than the spaces between the pattern 5 pillars, whereby using these types of particle-filled materials would make a high conductivity filling structure as shown in FIG. 5 impossible to fabricate. Thus, the pillar spacing is designed in view of any nanoparticles in the D/A material. Here, the patterned surface 5 is only on the package 3 side of the assembly. But this is not limiting: the pattern 3 could be on the die 1 side instead, or on both surfaces. This will be further discussed below, specifically in relation to FIG. 9.

Throughout this disclosure and the claims, references to the package 3 and attachments to the package 3 refer to that portion of a package or housing where the die 1 is attached to a metal base primarily for improved thermal performance of the die 1. This portion of the package is often referred to in the art as a die pad, thermal slug, die attach paddle, die attach pad or lead frame (the metal part of a package around which a plastic material is typically molded to form a cavity for the die). In some cases, the final package is referred to as a housing, which terminology is used primarily for air cavity packages where the die is surrounded primarily by a vacuum or some gas mixture inside a housing that provides physical and optical protection for the die. So, this invention applies, but is not limited to, that part of a semiconductor device package 3 or housing where the die 1 is attached to the package 3 for the purpose of improved thermal performance of the die 1.

Note also that this invention can also be applied to the attachment surfaces of a printed circuit board and the external surfaces of the package, or between the attachment surfaces of the circuit board and the heat sink such as may be illustrated by FIG. 2, where improved thermal transport is also desirable because there is a poor interface to the heat sink. A preferred embodiment is one in which the package includes patterned surfaces both internal to the package (for die attach) and as part of the package outer surface (for subsequent attachment to the circuit or the heat sink) for the best possible thermal management.

It is helpful at this point to introduce the concept of surface area enhancement in more detail, because this is a key part of the invention. In the absence of micro-pillar patterning of the die 1 or package 3 surfaces, the surface area that provides adhesion of the die 1 to the package 3 and through which heat can flow is approximately equal to the area of the die 1 itself, or:

$$A_{bond} = A_{die}. \quad (1)$$

Consider now the structure in FIG. 5, where the increased bonding area is given by:

$$A_{bond} = A_{die} + A_{pattern} \quad (2)$$

where $A_{pattern}$ is the surface area represented by the side walls of the pattern 5 pillars, or given by $$A_{pattern} = 2\pi r h n \quad (3)$$

where r is the radius of the pattern 5 pillars, h is the height of each pillar, and n is the number of pillars directly under the die 1. Thus the Effective Bonding Area (EBA) ratio for the example shown in FIG. 5 is:

$$EBA = \frac{A_{die} + A_{pattern}}{A_{die}}. \quad (4)$$

Note that in the simplified illustration of FIG. 5, the radius r is constant over the entire height h of each pillar. In general, this is not required, see, e.g., FIG. 7B with conical pillars. So while equations (1), (2) and (4) are generally applicable to any and all $A_{pattern}$ for any and all surface area enhancing patterns 5, equation (3) for $A_{pattern}$ is specific to constant-radius pillars such as are shown in FIG. 5. The objective of the invention is to increase the EBA ratio (4) as much as possible, irrespective pattern shape, to improve both bonding strength and the surface area for thermal transport across the interface between the D/A material 2 and the package 3, as illustrated in FIG. 5.

In addition to pattern 5 pillars, which here are envisioned to simply be round, unshaped pillars, other structures could be employed to form the surface area-enhancing pattern 5, as shown for illustration, not limitation, in the top-down views of FIGS. 6A, 6B, 6C and 6D. Of course, more shapes are possible, but the general rule for shape selection should be maximizing the EBA of the individual pillar, ease of fabrication (typically plating or compression forming would be envisioned), and stress-dissipation caused by the differential coefficients of thermal expansion of the materials involved.

Ordinarily, the die attach material 2 between the die 1 and the package 3 is a composite comprised of an adhesive, flux or other viscous material and particles of high thermal conductivity material (Ag particles, Cu particles, solder particles, BN (boron nitride), etc.). In order to maximize the contact between the die attach material 2 and the surfaces of the patterned substrate 5, it is preferred that any features introduced that increase the surface area of the patterned features 5 contain only external angles with a radius of curvature at the vertex which is sufficiently-obtuse as to be equal to or greater than the radius of the average conductive particle in the die attach composite D/A material 2. If the external angles are acute or in any other way create surface features too small for the particles of the composite D/A 2 to enter, then the potential is raised for voiding and reduced interfacial contact and poorer thermal performance. It will be seen that the top view cross-sections in each of FIGS. 6A, 6B, 6C and 6D meet this criteria: The external angles over the surfaces of the individual micro-components (e.g., pillars) of the surface area enhancing pattern 5 are greater than or equal to the average radius of conductive particles in the D/A material 2 used in combination with the surface area enhancing pattern 5.

Figure 7A:
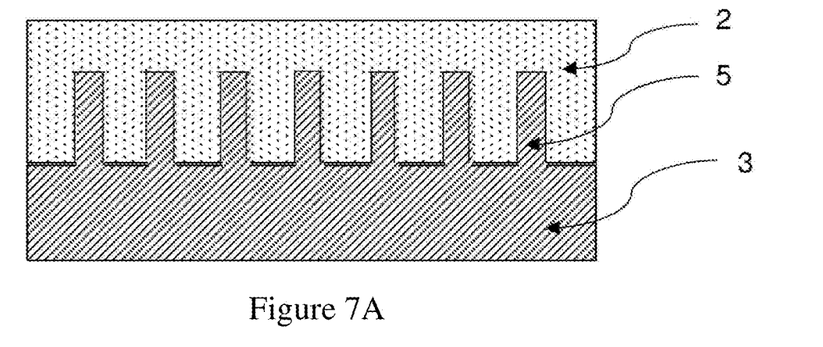
FIGS. 7A, 7B and 7C are side schematic views of a variety of pillar densities, shapes and patterns which can be optimized to maximize both thermal conductivity and bond strength.
Figure 7B:
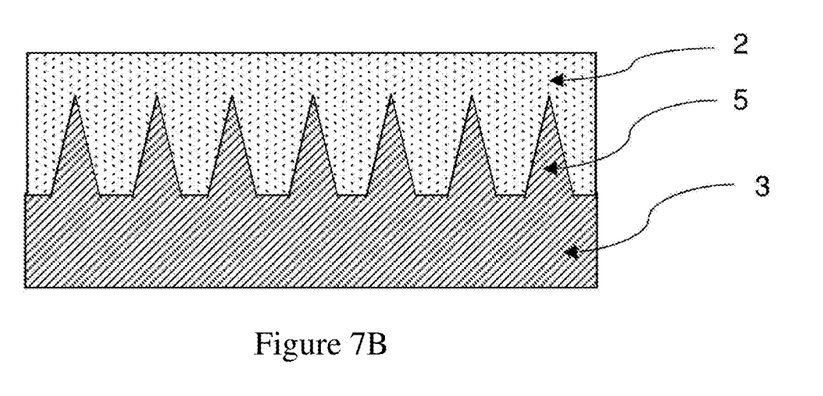
Figure 7C:
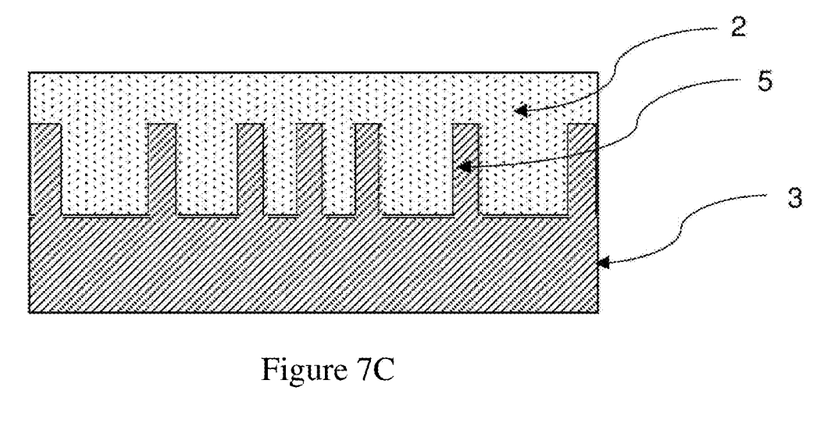

We turn now to FIGS. 7A, 7B and 7C. In these figures, the die 1 itself is not shown; what we see is the penetration of surface area enhancing pattern 5 pillars into the D/A material 2 in several exemplary, non-limiting configurations. For example, while FIG. 7A which reproduces the right-hand part of FIG. 5, shows round, unshaped pillars for which $A_{pattern}$ is calculated using equation (3), the conical shape illustrated in FIG. 7B for pillars the surface area enhancing pattern 5 pillars may be advantageous because this can provide a smoother transition from the patterned submount to the continuous D/A material 2 under the die 1 (not shown). However, such conical cross sections could be more difficult to fabricate by simple plating methods.

Another embodiment, shown in FIG. 7C, involves the use of a variable pattern of surface area enhancing pattern 5 pillars penetrating into the D/A material 2 under the die 1 (not shown). These pillars are arranged in order to cool the hottest part of the die 1 while providing good adhesion at the edges of the die 1. Over the domain from left to right in FIG. 7C, the die 1 is presumed to be substantially wide as the D/A material 2; thus, the thermal physics will cause the hottest part of the die 1 to be at the center of FIG. 7C. So to optimize thermal management, one would fabricate the greatest pillar density in the hottest region, which is why a higher pillar density is illustrated near the center of FIG. 7C.

In general, the selection of various advantageous pillar shapes and patterns can be modeled using various finite element analysis tools that compute both thermal and strain fields in complex multicomponent systems such as are envisioned here, in which pillar shapes, pillar heights, total D/A material 2 thickness, and customized patterns (e.g. spacings between pillars) can be optimized and employed in various combinations without limitation, for the particular bonding requirements of a given application.

Figure 8:
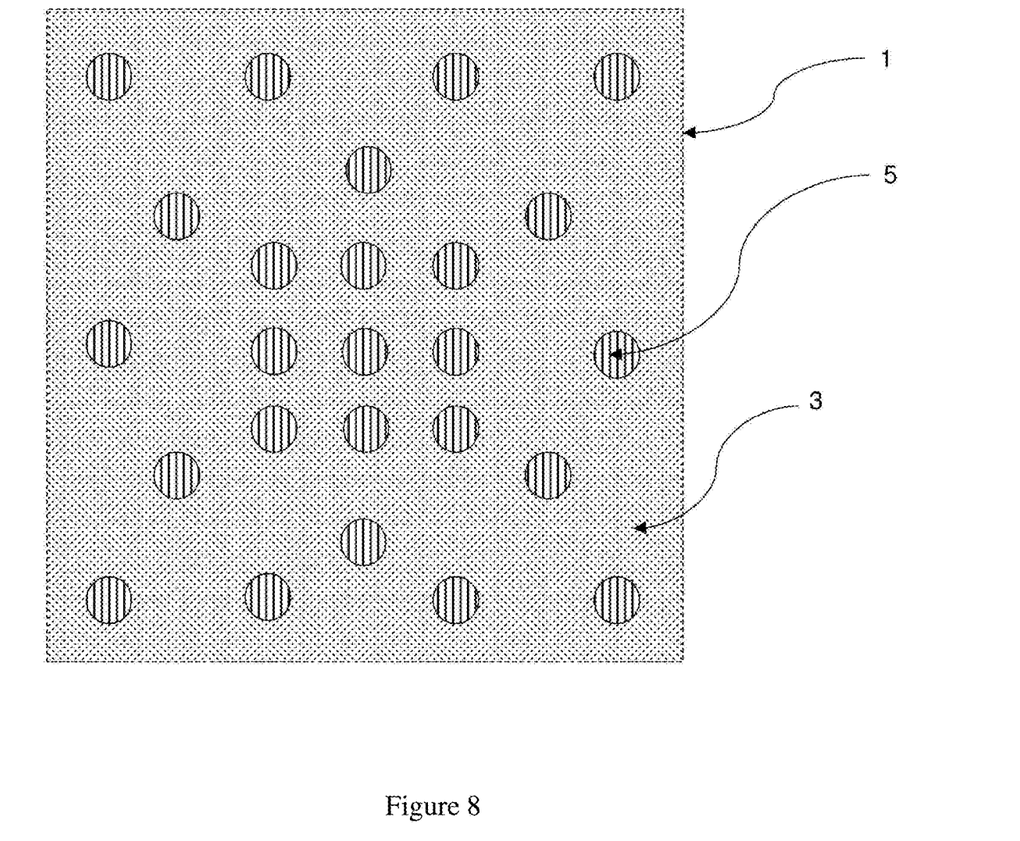
FIG. 8 is a top schematic view example of the variable-density pillar packing of FIG. 7C.

It is instructive to consider the non-periodic layout of the pillar structure shown in FIG. 7C, next shown in a top-down view in FIG. 8 over a two-dimensional planar cross section. Here, with the round elements representing the surface area enhancing pattern 5 pillars, the pillar packing density is higher near the center of the die 1. Typically, it is here near the center, where the die 1 would be the hottest during normal operation, and where the strain due to thermal mismatch would be the greatest. So aside from the mechanical and thermal advantages during use after fabrication, this structure is also advantageous in certain methods of fabrication envisioned in this invention.

For example, one case where this provides and advantage is the fabrication of the assembly using a solder as the D/A material 2. Ordinarily, a solder includes a flux material designed to promote the wetting of the solder when molten to the material it is intended to attach to. Ordinarily, the flux needs to escape during the bonding process, but sometimes cannot, and so leaves behind voids 4 where the flux could not escape during fabrication. For the pattern in FIG. 7C a.k.a. FIG. 8, wetting would be strongest in the center of the die/package structure where there is more surface area from the pillars. As a result, wetting would naturally proceed from the center (higher heat regions) to the outside edge (lower heat regions), promoting the escape of the flux and any developing voids out the sides, for a superior die attach compared to what is achieved with normal planar, unpatterned surfaces.

Now let us discuss materials, applications, and methods of fabrication. The use of patterned interfaces for improved bonding of semiconductor devices can be applied to a wide variety of electronic die, including silicon integrated circuits (e.g. microprocessors) and discrete electronic devices (power transistors or light emitting diodes). In addition, the invention can also be used to attach packaged semiconductor devices to other surfaces where both strength and thermal management are important, in particular surface mount packed devices on printed circuit boards (PCBs) or metal clad PCBs (MCPCBs), and in the attachment of PCBs or MCPCBs to heat sinks.

Other D/A materials 2 can be any adhesive (epoxies, silicones), including filled adhesives (e.g., Ag filled epoxy) provided the size of the thermally conductive filler is substantially smaller than the minimum separation between the surface area enhancing pattern 5 pillars. This also includes solder paste or solder preforms, nano-metal paste or nano-metal preforms (both Ag and Cu nano-metallic die attach materials are available now), or die attach with a hybrid composite such as solder in epoxy, solder in silicone, Ag filled epoxies, and silicones. In some cases, it may be desirable to use pressure bonding techniques to ensure that the die attach material used completely fills all of the spaces between the die 1, the pillars, and the base of the housing. Ordinarily, such pressures are in the range of 1 to 10 MPa, depending on the die attach material and the BLT. Performing the die attach under pressured as high as 10 MPa ensure void minimization.

The methods for forming the patterned surfaces can, in the case of the package 3 surface, include coining, electroplating or skiving (the use of a blade to form surface area enhancing pattern 5 fins or pillars akin to how a plow shapes furrows in soil). Ordinarily, the preferred pillar composition is copper, which may for purposes of improved adhesion to the D/A material 2 may be plated with another metal (ordinarily gold or nickel). Other materials employed in the art for electronic device fabrication can also be used, depending on the application. For pillars formed directly on the die 1 (which will momentarily be elaborated in FIG. 9), it is desirable, though not limiting, to use electroplating through lithographically-defined openings to the metallization on the bottom of the die 1.

Ideally, the pillar surface area should be maximized per equation (4). But, the height of the pillar should be roughly on the order of conventional D/A material 2 thicknesses, that is, ~25 μm or less. Furthermore, if the patterning only occurs on one of the surfaces (i.e., the die 1 or the package 3 but not both), the application of the D/A material 2 (solder, adhesive or nano-Ag) should be thick enough so that when assembly is completed (soldering, sintering, curing), the top of the pillar is not in contact with the die 1 if the pillars 5 are on the package 3, or with the package 3 if conversely the pillars 5 are on the die 1. This is all shown in FIGS. 5 and 7, wherein the pillars 5 are shown to be shorter than the full thickness of the D/A material 2 in the finished (soldered, sintered, cured) state.

One preferred embodiment for fabrication method is to use nano-Ag materials that are available in a film form, wherein the film is laminated to the patterned surface prior to die attach. Lamination is preferred to force the formable nano-Ag film into the spaces between the pillars and to the bottom plane between the pillars. In this case, the pillar height and nano-Ag film thickness should be selected so that once the final sintering operation (to complete the D/A process) is finished, the pillar height is at least 40% or 50% to at most 80% or 90% of the total separation (bond line thickness) between the bottom of the die 1 and the base of the pillars where they meet the package 3, see FIG. 5. The heights of the pillars and the total volume of the die attach material 2 need to be selected to reflect shrinkage of the die attach material 2 during sintering, solder reflow or other curing processes to ensure that the die 1 does not contact the tops of the pillars. Or, if pillars are on both the housing and the die 1 as will next be reviewed in FIG. 9, the tops of the pillars should not contact each other, which would lead to excessive void 4 formation.

Figure 9:
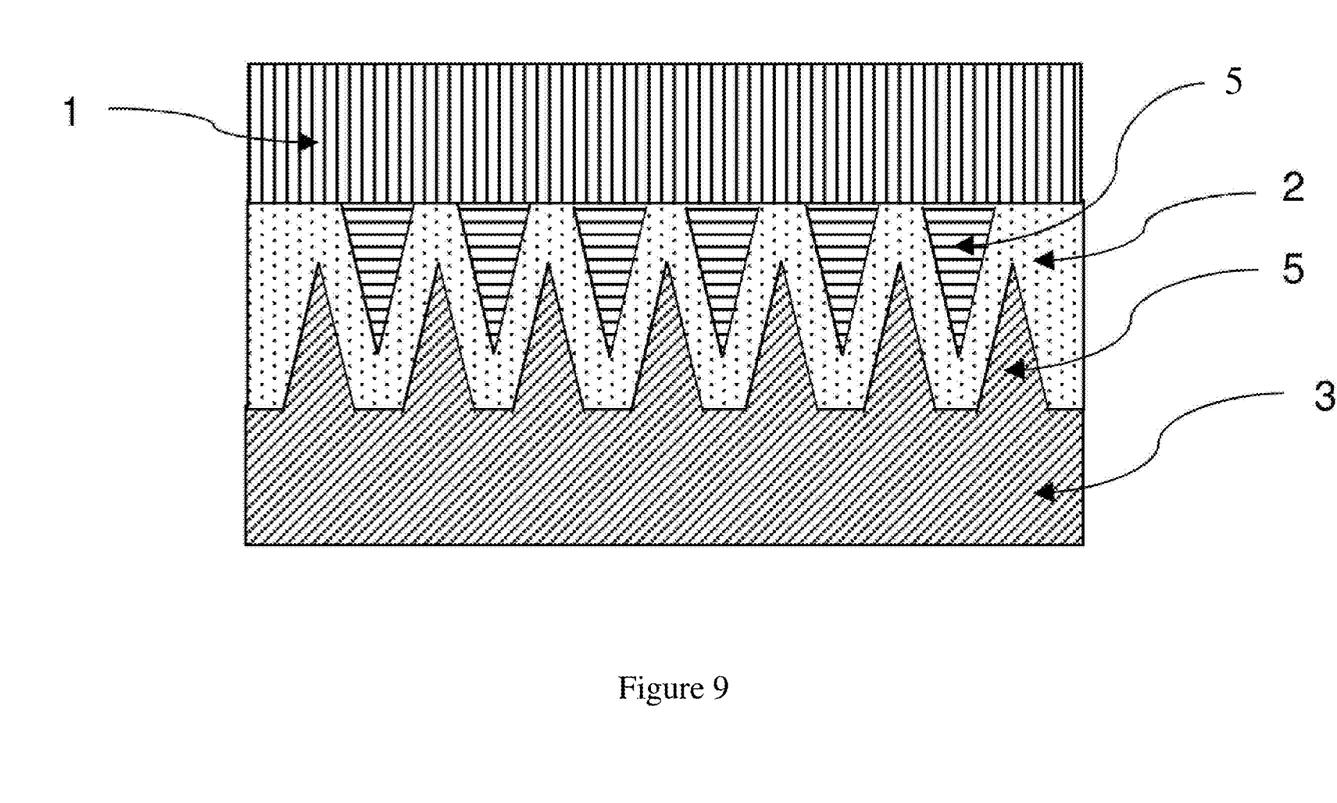
FIG. 9 is a schematic plan view illustrating a non-limiting example of patterned surfaces on both the die and the package surfaces. In this schematic, the density and size of the cones are nominally the same on both surfaces.

It is also possible to pattern both die 1 and package 3 surfaces with surface area enhancing pattern 5 pillars, as shown in FIG. 9. In this example, interpenetrating features are shown, as this can have the advantage of forcing D/A material 2 into the interstitial spaces between the pillars on both surfaces. Of course, careful alignment of the die 1 relative to the package 3 is required to ensure that the tops of the pillars do not collide during assembly. This can be achieved using a special pattern for the pillars on each surface, and suitable alignment marks that can be read by the die attach machine during placement of the die 1 onto the package 3 surface. Of course a combination of the various pillar shapes/pattern placements described above can be used with pillar patterns on both the die 1 and the package 3 surfaces, without limitation. It will also be appreciated and understood that the EBA is greatest when both sides of the D/A interface are patterned. It is not necessary that the structures interpenetrate as shown in FIG. 9. The thickness of the D/A material 2 should still vertically fill between 10% and 60%, or 20% and 50% (i.e., the 100% minus the earlier-mentioned 40% to 90% or 50% to 80%) of the total distance between bottom planes of both sets of pillars.

It should also be noted in FIG. 9, that the downward surface area enhancing pattern 5 comprising conic pillars attached to the bottom of die 1, may be pillars comprising a different material than that of the die 1. Preferably, these would comprise a metal that would be up-plated directly from a planar metal that is part of an electrical contact or bottom surface of the die 1 element. It could, but probably would not be the same material, because metals attached to die 1 typically differ from metals used for the thermal slug or bonding pad of the package. This is because metal on the chip needs to be metallurgically-compatible (good adhesion, bonding without diffusion into the die) with the bottom surface of the die 1 material.

Ordinarily, all die 1 have a specially-designed metallization on the surface involved in the die attach process. This metallization is intended to protect the die 1 from any reactive components in the die attach material 2, to improve adhesion between the die 2 and the die attach material 2. In some cases, it also provides a nominally ohmic electrical contact to the die 1 itself. In the event that a die 1 is patterned with surface area enhancing pattern 5 e.g. pillars at its attach surface to reduce thermal interface impedance in the manner illustrated by FIG. 9, the metal used to form the pattern 5 should be the same as the outward facing metal of the planar part of the die 1 metallization. This metal is ordinarily Au, but can be Al, Ni, Cu, or any other metal uses as the outer metal of the die 1 used for die attach. In this way, providing the surface area enhancing pattern 5 on the bottom of the die 1 (in addition to or in lieu of that on the top of the package 3) creates no additional thermal (or mechanical) interfaces in the nature of those shown in FIG. 2.

The mechanical strength and reliability of this approach to D/A is due to both the increased surface area (EBA>1) that provides greater area for adhesion of the D/A material 2 to both the package 3 and the die 1, and the difficulty of crack propagation in the D/A material 2 between the die 1 and the package 3 because of the presence of the surface area enhancing pattern 5 such as but not limited to the pillars.

Finally, it will be seen through even a rough geometric examination of FIGS. 5, 7 and 9 that the EBA calculated using equation (4) can readily be significantly greater than 1. For example, referring to the prototypical FIG. 7A, if this side view cross section was to represent a uniform density of pillars in both the x and y directions of FIG. 8, it is readily deduced that the surface area is more than doubled, i.e., that the ratio EBA≥2.0, and in fact is close to tripled, EBA~3.0. While the exact EBA will depend on the value of $A_{pattern}$ which again will vary based on the particular surface area enhancing pattern 5 geometry including any density variations such as are shown in FIGS. 7C and 8, at a bare minimum it is straightforward to achieve $EBA_{package} \geq 1.5$ for surface area enhancing patterns 5 added to the package 3, and to likewise achieve $EBA_{die} \geq 1.5$ for surface area enhancing patterns 5 added to the die 1 in the manner shown in FIG. 9. More generally, EBA≥2.0, EBA≥2.5 and even EBA≥3.0 are all realistic outcomes using suitable geometric designs, for each of the die 1 and/or the package 3, depending upon whether one or both are given a surface area enhancing pattern 5.

The knowledge possessed by someone of ordinary skill in the art at the time of this disclosure, including but not limited to the prior art disclosed with this application, is understood to be part and parcel of this disclosure and is implicitly incorporated by reference herein, even if in the interest of economy express statements about the specific knowledge understood to be possessed by someone of ordinary skill are omitted from this disclosure. While reference may be made in this disclosure to the invention comprising a combination of a plurality of elements, it is also understood that this invention is regarded to comprise combinations which omit or exclude one or more of such elements, even if this omission or exclusion of an element or elements is not expressly stated herein, unless it is expressly stated herein that an element is essential to applicant's combination and cannot be omitted. It is further understood that the related prior art may include elements from which this invention may be distinguished by negative claim limitations, even without any express statement of such negative limitations herein. It is to be understood, between the positive statements of applicant's invention expressly stated herein, and the prior art and knowledge of the prior art by those of ordinary skill which is incorporated herein even if not expressly reproduced here for reasons of economy, that any and all such negative claim limitations supported by the prior art are also considered to be within the scope of this disclosure and its associated claims, even absent any express statement herein about any particular negative claim limitations.

Finally, while only certain preferred features of the invention have been illustrated and described, many modifications, changes and substitutions will occur to those skilled in the art. It is, therefore, to be understood that the appended claims are intended to cover all such modifications and changes as fall within the true spirit of the invention.

I claim:

1. A mechanically-stable and thermally-conductive interface device between a semiconductor die and a package for said die, comprising:
    a semiconductor die;
    a package for said die;
    a surface area-enhancing pattern on at least one of said package and said die;
    die attach materials between said die and said package, said die attach materials attaching said die to said package through an interface provided by said die attach materials; and
    a metallization of said surface area-enhancing pattern which is substantially similar to a metallization of said semiconductor die or said die package to which said pattern is interfaced; wherein:
    an effective bonding area between said die attach materials and said at least one of said package and said die is greater with said pattern than without said pattern;
    said increase of said effective bonding area simultaneously increases the surface area for thermal transport between said at least one of said package and said die, and said die attach materials; and increases the surface area for stably attaching said at least one of said package and said die to said die attach materials;
    a ratio of said effective bonding area with said surface area-enhancing pattern over said effective bonding area without said surface area-enhancing pattern is given by:

$$EBA = \frac{A_{die} + A_{pattern}}{A_{die}},$$

where $A_{die}$ is a contact surface area of said die without said pattern and $A_{pattern}$ is a contact surface area of said pattern; and
    said surface area-enhancing pattern is configured such that said EBA≥1.5.

2. The device of claim 1, said surface area-enhancing pattern comprising a large plurality of microscopic pillars.

3. The device of claim 1, said surface area-enhancing pattern comprising higher densities in center device regions which become the hotter during device operation, and lesser densities in outer device regions which become less hot during device operation.

4. The device of claim 1, said package comprising said surface area-enhancing pattern.

5. The device of claim 1, said die comprising said surface area-enhancing pattern.

6. The device of claim 1, wherein said surface area-enhancing pattern has a height of at least 40% of a bond line thickness between a bottom of said die and a top of said package.

7. A method for fabricating mechanically-stable and thermally-conductive interface device between a semiconductor die and a package for said die, comprising:
providing a semiconductor die;
providing a package for said die;
fabricating a surface area-enhancing pattern on at least one of said package and said die;
attaching said die to said package through an interface by introducing die attach materials between said die and said package; and
providing a metallization of said surface area-enhancing pattern which is substantially similar to a metallization of said semiconductor die or said die package to which said pattern is interfaced; thereby:
providing a greater effective bonding area between said die attach materials and said at least one of said package and said die with said pattern than without said pattern; and
simultaneously increasing the surface area for thermal transport between said at least one of said package and said die, and said die attach materials; and increasing the surface area for stably attaching said at least one of said package and said die to said die attach materials; wherein:
a ratio of said effective bonding area with said surface area-enhancing pattern over said effective bonding area without said surface area-enhancing pattern is given by:

$$EBA = \frac{A_{die} + A_{pattern}}{A_{die}},$$

where $A_{die}$ is a contact surface area of said die without said pattern and $A_{pattern}$ is a contact surface area of said pattern; and further comprising:
configuring said surface area-enhancing pattern such that said $EBA \geq 1.5$.

8. The method of claim 7, further comprising fabricating said surface area-enhancing pattern to comprise a large plurality of microscopic pillars.

9. The method of claim 7, further comprising fabricating said surface area-enhancing pattern to comprise higher densities in center device regions which become the hotter during device operation, and lesser densities in outer device regions which become less hot during device operation.

10. The method of claim 9, said die attach materials comprising a solder including a flux material to facilitate wetting; and
bonding said die with said package using said die attach materials including said flux material; wherein:
wetting naturally proceeds from said center to said outer regions of said device, thereby promoting escape of said flux and any developing voids through said outer regions.

11. The method of claim 7, further comprising fabricating said package to comprise said surface area-enhancing pattern.

12. The method of claim 7, further comprising fabricating said die to comprise said surface area-enhancing pattern.

13. The method of claim 7, further comprising fabricating said surface area-enhancing pattern to comprise a height of at least 40% of a bond line thickness between a bottom of said die and a top of said package.

14. A mechanically-stable and thermally-conductive interface device between a semiconductor die and a package for said die, comprising:
a semiconductor die;
a package for said die;
a surface area-enhancing pattern on at least one of said package and said die;
die attach materials between said die and said package, said die attach materials attaching said die to said package through an interface provided by said die attach materials;
said die attach materials comprising conductive particles; and
a metallization of said surface area-enhancing pattern which is substantially similar to a metallization of said semiconductor die or said die package to which said pattern is interfaced; wherein:
an effective bonding area between said die attach materials and said at least one of said package and said die is greater with said pattern than without said pattern:
said increase of said effective bonding area simultaneously increases the surface area for thermal transport between said at least one of said package and said die, and said die attach materials; and increases the surface area for stably attaching said at least one of said package and said die to said die attach materials; and
external angles over surfaces of micro-components of said surface area-enhancing pattern are configured to comprise a radius of curvature which is greater than or equal to an average radius of said conductive particles in said die attach materials.

15. The device of claim 14, said surface area-enhancing pattern comprising a large plurality of microscopic pillars.

16. The device of claim 14, said surface area-enhancing pattern comprising higher densities in center device regions which become the hotter during device operation, and lesser densities in outer device regions which become less hot during device operation.

17. The device of claim 14, said package comprising said surface area-enhancing pattern.

18. The device of claim 14, said die comprising said surface area-enhancing pattern.

19. The device of claim 14, wherein said surface area-enhancing pattern has a height of at least 40% of a bond line thickness between a bottom of said die and a top of said package.

20. A method for fabricating mechanically-stable and thermally-conductive interface device between a semiconductor die and a package for said die, comprising:
providing a semiconductor die;
providing a package for said die;
fabricating a surface area-enhancing pattern on at least one of said package and said die;
attaching said die to said package through an interface by introducing die attach materials between said die and said package:
fabricating external angles over surfaces of micro-components of said surface area-enhancing pattern to comprise a radius of curvature which is greater than or equal to an average radius of conductive particles in die attach materials contained within said die attach materials;

bonding said die with said package using said die attach materials comprising said conductive particles; and providing a metallization of said surface area-enhancing pattern which is substantially similar to a metallization of said semiconductor die or said die package to which said pattern is interfaced; thereby:

providing a greater effective bonding area between said die attach materials and said at least one of said package and said die with said pattern than without said pattern; and simultaneously increasing the surface area for thermal transport between said at least one of said package and said die, and said die attach materials; and increasing the surface area for stably attaching said at least one of said package and said die to said die attach materials.

21. The method of claim 20, further comprising fabricating said surface area-enhancing pattern to comprise a large plurality of microscopic pillars.

22. The method of claim 20, further comprising fabricating said surface area-enhancing pattern to comprise higher densities in center device regions which become the hotter during device operation, and lesser densities in outer device regions which become less hot during device operation.

23. The method of claim 22, said die attach materials comprising a solder including a flux material to facilitate wetting; and bonding said die with said package using said die attach materials including said flux material; wherein:

wetting naturally proceeds from said center to said outer regions of said device, thereby promoting escape of said flux and any developing voids through said outer regions.

24. The method of claim 20, further comprising fabricating said package to comprise said surface area-enhancing pattern.

25. The method of claim 20, further comprising fabricating said die to comprise said surface area-enhancing pattern.

26. The method of claim 20, further comprising fabricating said surface area-enhancing pattern to comprise a height of at least 40% of a bond line thickness between a bottom of said die and a top of said package.

27. A mechanically-stable and thermally-conductive interface device between a semiconductor die and a package for said die, comprising:

a semiconductor die;
a package for said die;
die attach materials between said die and said package, said die attach materials attaching said die to said package through an interface provided by said die attach materials;
said package and said die each comprise said surface area-enhancing pattern; and
a metallization of said surface area-enhancing pattern which is substantially similar to a metallization of said semiconductor die or said die package to which said pattern is interfaced; wherein:
an effective bonding area between said die attach materials and said at least one of said package and said die is greater with said pattern than without said pattern; and
said increase of said effective bonding area simultaneously increases the surface area for thermal transport between said at least one of said package and said die, and said die attach materials; and increases the surface area for stably attaching said at least one of said package and said die to said die attach materials.

28. The device of claim 27, said surface area-enhancing pattern comprising a large plurality of microscopic pillars.

29. The device of claim 27, said surface area-enhancing pattern comprising higher densities in center device regions which become the hotter during device operation, and lesser densities in outer device regions which become less hot during device operation.

30. The device of claim 27, wherein said surface area-enhancing pattern has a height of at least 40% of a bond line thickness between a bottom of said die and a top of said package.

31. A method for fabricating mechanically-stable and thermally-conductive interface device between a semiconductor die and a package for said die, comprising:

providing a semiconductor die;
providing a package for said die;
attaching said die to said package through an interface by introducing die attach materials between said die and said package;
fabricating said package and said die to each comprise said surface area-enhancing pattern; and
providing a metallization of said surface area-enhancing pattern which is substantially similar to a metallization of said semiconductor die or said die package to which said pattern is interfaced; thereby:
providing a greater effective bonding area between said die attach materials and said at least one of said package and said die with said pattern than without said pattern; and
simultaneously increasing the surface area for thermal transport between said at least one of said package and said die, and said die attach materials; and increasing the surface area for stably attaching said at least one of said package and said die to said die attach materials; and further comprising.

32. The method of claim 31, further comprising fabricating said surface area-enhancing pattern to comprise a large plurality of microscopic pillars.

33. The method of claim 31, further comprising fabricating said surface area-enhancing pattern to comprise higher densities in center device regions which become the hotter during device operation, and lesser densities in outer device regions which become less hot during device operation.

34. The method of claim 33, said die attach materials comprising a solder including a flux material to facilitate wetting; and bonding said die with said package using said die attach materials including said flux material; wherein:

wetting naturally proceeds from said center to said outer regions of said device, thereby promoting escape of said flux and any developing voids through said outer regions.

35. The method of claim 31, further comprising fabricating said surface area-enhancing pattern to comprise a height of at least 40% of a bond line thickness between a bottom of said die and a top of said package.

* * * * *